(12) United States Patent
Wagiman et al.

(10) Patent No.: US 9,070,787 B2
(45) Date of Patent: Jun. 30, 2015

(54) PACKAGE-ON-PACKAGE ASSEMBLY AND METHOD

(71) Applicant: Intel Corporation, Santa Clara, CA (US)

(72) Inventors: Amir Wagiman, Kedah (MY); Thor Soo Fung, Penang (MY); Fong Chin Yee, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/278,737

(22) Filed: May 15, 2014

(65) Prior Publication Data

US 2014/0248741 A1    Sep. 4, 2014

Related U.S. Application Data

(62) Division of application No. 12/239,499, filed on Sep. 26, 2008, now abandoned.

(51) Int. Cl.
*H01L 23/492* (2006.01)
*H01L 25/10* (2006.01)
*H01L 23/00* (2006.01)
*H01L 23/498* (2006.01)
*H01L 25/00* (2006.01)

(52) U.S. Cl.
CPC .......... *H01L 24/83* (2013.01); *H01L 23/49811* (2013.01); *H01L 23/49883* (2013.01); *H01L 25/105* (2013.01); *H01L 2224/16225* (2013.01); *H01L 2225/1023* (2013.01); *H01L 2225/1047* (2013.01); *H01L 2224/45147* (2013.01); *H01L 2924/01047* (2013.01); *H01L 2924/00014* (2013.01); *H01L 2224/16* (2013.01); *H01L 2224/73204* (2013.01); *H01L 25/50* (2013.01)

(58) Field of Classification Search
CPC ................................ H01L 24/83; H01L 25/50
USPC .................................................. 438/107–109
See application file for complete search history.

(56) References Cited

U.S. PATENT DOCUMENTS

| | | | |
|---|---|---|---|
| 6,190,578 B1 * | 2/2001 | Yokoyama et al. | 252/512 |
| 2003/0156402 A1 * | 8/2003 | Ding et al. | 361/820 |
| 2005/0132568 A1 * | 6/2005 | Asai et al. | 29/868 |
| 2005/0287785 A1 * | 12/2005 | Lee | 438/613 |
| 2005/0288427 A1 | 12/2005 | Jeon et al. | |
| 2006/0124699 A1 | 6/2006 | Farrar et al. | |
| 2007/0290315 A1 | 12/2007 | Emma et al. | |
| 2008/0136003 A1 | 6/2008 | Pendse | |
| 2008/0174023 A1 * | 7/2008 | Park | 257/773 |
| 2009/0127687 A1 | 5/2009 | Fan | |

* cited by examiner

*Primary Examiner* — Shaun Campbell
*Assistant Examiner* — Raj R Gupta
(74) *Attorney, Agent, or Firm* — Winkle, PLLC

(57) ABSTRACT

A package-on-package (PoP) assembly is provided. The package-on-package (PoP) assembly includes a first integrated circuit package and an anisotropic conductive film (ACF) disposed on a top surface of the first integrated circuit package, wherein the anisotropic conductive film comprises a plurality of conductive particles. The package-on-package (PoP) assembly also includes a second integrated circuit package disposed on a top surface of the anisotropic conductive film.

13 Claims, 5 Drawing Sheets

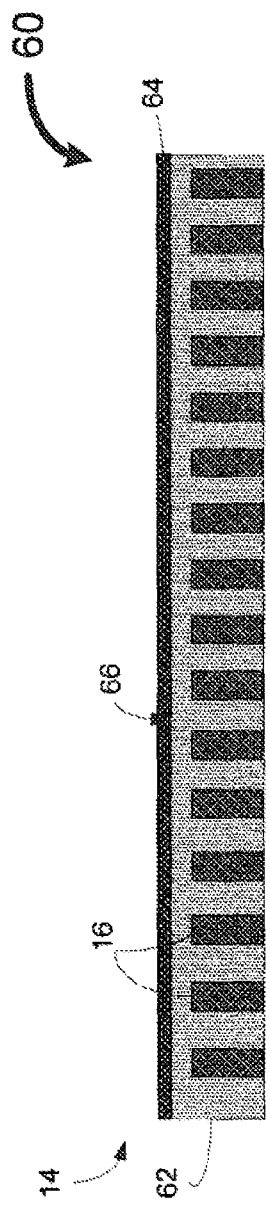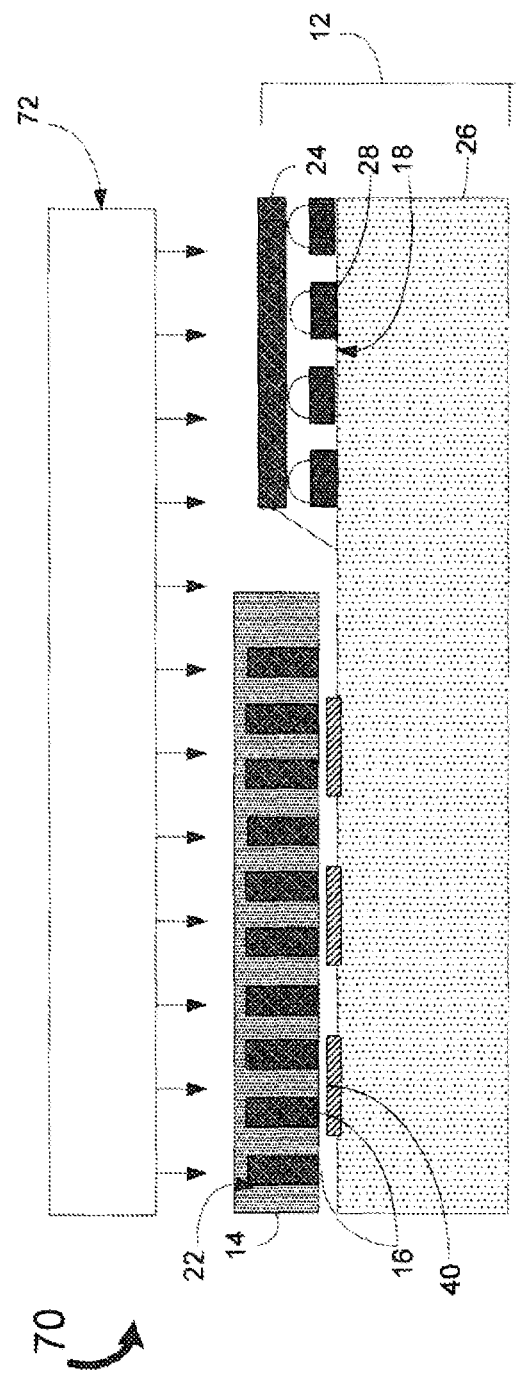
FIG. 3
FIG. 4

PACKAGE-ON-PACKAGE ASSEMBLY AND METHOD

CROSS-REFERENCING WORK

The present application is a divisional application of prior U.S. patent application Ser. No. 12/239,499, filed on Sep. 26, 2008, entitled "PACKAGE-ON-PACKAGE ASSEMBLY AND METHOD" incorporated by reference herein in its entirety.

BACKGROUND

With recent advancements in the semiconductor manufacturing technology microelectronic components are becoming smaller and circuitry within such components is becoming increasingly dense. To reduce the dimensions of such components, the structures by which these components are packages and assembled with circuit boards must become more compact.

Package-on-package stacking of semiconductor devices is one known packaging technique in the art. Typically, such packages include a top integrated circuit package and a bottom integrated circuit package. One method of connecting the top integrated circuit package to the bottom integrated circuit package is through solder balls. In order to meet a desired gap height of the packaged assembly, a solder ball size may be increased. However, this may result in a large package font factor and may also cause solder bridging.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 3 illustrates an exemplary configuration of the anisotropic conductive film employed in the package-on-package assembly of FIG. 1 in accordance with embodiments of present technique;

FIG. 4 illustrates an exemplary configuration for bonding the anisotropic conductive film to the first integrated circuit package of the package-on-package assembly of FIG. 1 in accordance with embodiments of present technique;

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

As discussed in detail below, the embodiments of the present invention function to provide a method of forming interconnections for a package-on-package assembly. In particular, the technique uses an anisotropic conductive film having conductive particles to connect two stacking packages in the package-on-package assembly.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The following description includes terms, such as top, bottom etc. that are used for descriptive purposes only and are not to be construed as limiting. The embodiments of the device or article described herein can be manufactured or used in a number of positions and orientations.

Figure 1:
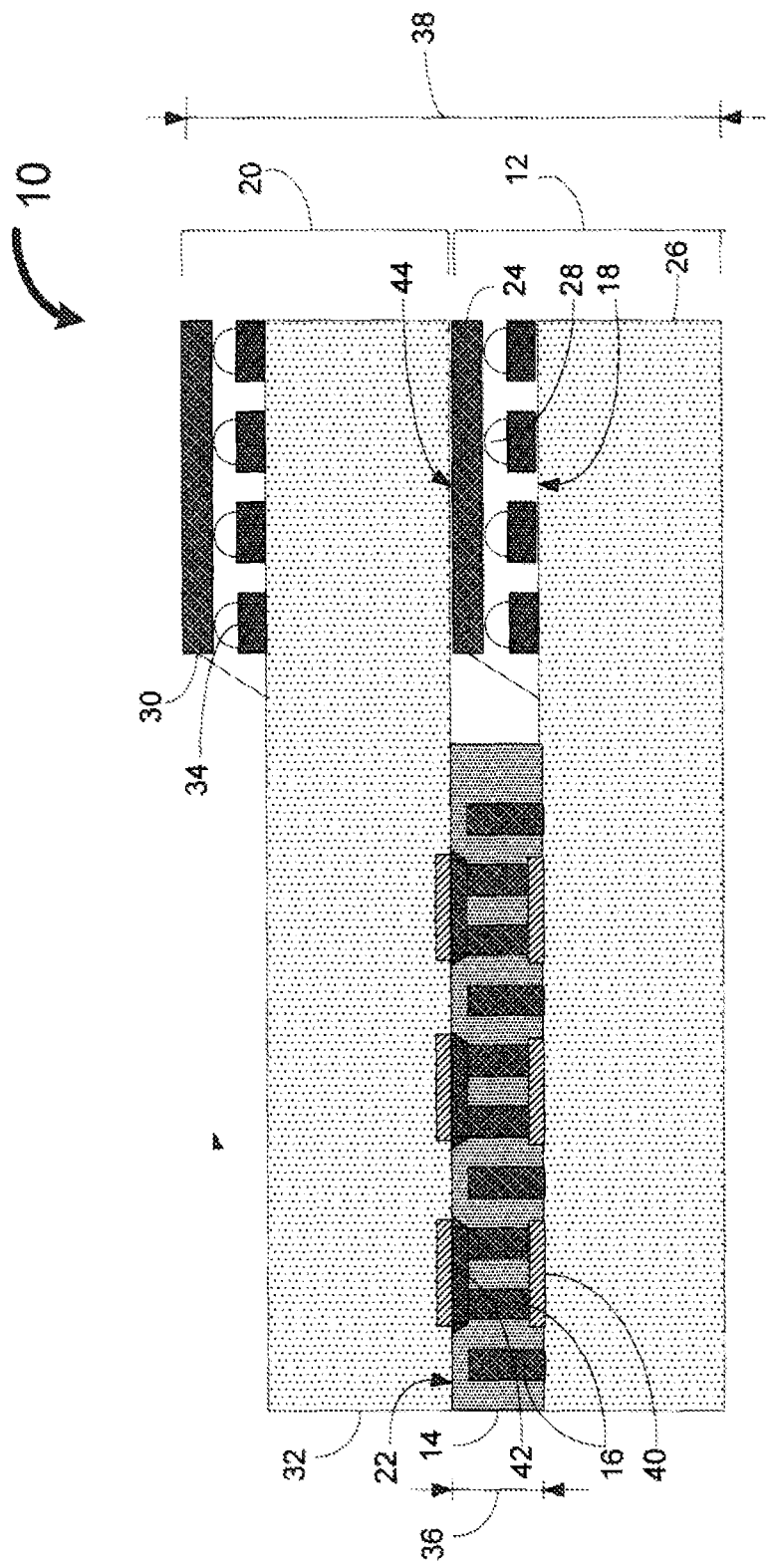
FIG. 1 illustrates a package-on-package (PoP) assembly in accordance with embodiments of present technique.

Referring first to FIG. 1, a package-on-package (PoP) assembly 10 is illustrated. The package-on-package (PoP) assembly 10 includes a first integrated circuit package 12. Further, package-on-package (PoP) assembly 10 includes an anisotropic conductive film (ACF) 14 having a plurality of conductive particles 16 disposed on a top surface 18 of the first integrated circuit package 12. The anisotropic conductive film 14 is a lead free and an environment friendly epoxy system and is readily available in the market. The package-on-package (PoP) assembly 10 also includes a second integrated circuit package 20 disposed on a top surface 22 of the anisotropic conductive film 14.

In this exemplary embodiment, the first integrated circuit package includes a die 24 coupled to a substrate 26. The substrate 26 may be formed of a variety of materials including ceramic and printed circuit boards. Further, the substrate 26 may be a one-layer board or a multi-layer board. In certain embodiments, the die 24 forms one of a data storage device, a digital signal processor, a micro-controller and a hand-held device. Typically, the die 24 is attached to one side of the substrate 26 and the attachment may be through a plurality of controlled collapse chip connection (C4) bumps 28. However, other attachment techniques may be envisaged. Similarly, the second integrated circuit package 20 includes a die 30 coupled to a substrate 32 through a plurality of controlled collapse chip connection bumps 34.

In this exemplary embodiment, the anisotropic conductive film 14 with the conductive particles 16 electrically and mechanically couples the first and second integrated circuit packages 12 and 20. Typically the elasticity of the compressed trapped conductive particles 16 between the first and second integrated circuit packages 12 and 20 causes them to press outward on contact points thereby facilitating the electrical and mechanical connections between the first and second integrated circuit packages 12 and 20.

In one exemplary embodiment, the anisotropic conductive film 14 comprises a polyester film. In one exemplary embodiment, a thickness of the anisotropic conductive film 14 is about 180 microns. In the illustrated embodiment, the anisotropic conductive film 14 comprises a uniform array of conductive rods 16 disposed within the anisotropic conductive film 14. In one exemplary embodiment, a diameter of each of the conductive rods 16 is about 50 microns. A plurality of shapes of the conductive particles 16 may be envisaged. Exemplary shapes include, but are not limited to, cylindrical, square, and cubical shapes.

In one exemplary embodiment, a pitch of the conductive particles 16 is about 100 microns. In one exemplary embodiment, a thickness of the each of the conductive particles is about 150 microns. In certain embodiments, a gap height 36 between the first and second integrated circuit packages 12 and 20 is controlled by the thickness of the anisotropic conductive film 14 and provides better control of a total thickness 38 of the package-on-package assembly 10. The anisotropic conductive film 14 with uniformly aligned conductive particles 16 provides relatively better interconnection properties such as fine pitch and low contact resistance. Moreover, the material of the anisotropic conductive film 14 is selected such that it maintains surface flatness and provides better bonding between the first and second integrated circuit packages 12 and 20.

In the illustrated embodiment, the first integrated circuit package 12 includes a plurality of copper pads 40 disposed on the top surface 18 of the first integrated circuit package 12. Further, the second integrated circuit package 20 includes a solder paste 42 disposed in a plurality of locations on a bottom surface 44 of the second integrated circuit package 20. The anisotropic conductive film 14 is disposed between the first and second integrated circuit packages 12 and 20 such that the conductive particles 16 are aligned between the plurality of copper pads 40 of the first integrated circuit package 12 and the corresponding solder paste 42 of the second integrated circuit package 20.

Figure 2:
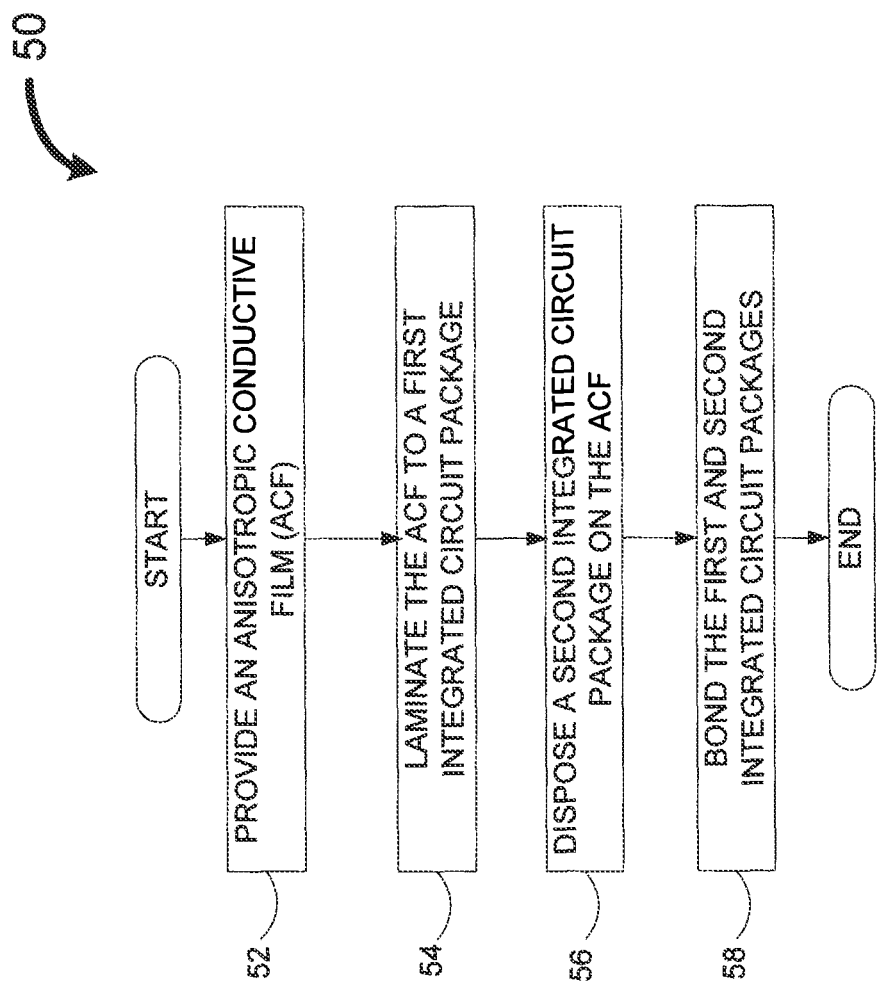
FIG. 2 illustrates an exemplary process for forming the package-on-package assembly of FIG. 1 in accordance with embodiments of present technique.

FIG. 2 illustrates an exemplary process 50 for forming the package-on-package assembly 10 of FIG. 1 in accordance with embodiments of present technique. At block 50, an anisotropic conductive film is provided. In this exemplary embodiment, the anisotropic conductive film comprises a plurality of conductive particles disposed within the anisotropic conductive film. In one exemplary embodiment, the plurality of conductive particles comprises conductive rods. In one embodiment, a thickness of the anisotropic conductive film and a thickness of each of the plurality of conductive particles is selected to achieve a desired gap height between two packages of the package-on-package assembly. In one exemplary embodiment, the anisotropic conductive film comprises a polyester film.

At block 54, the anisotropic conductive film is laminated to a first integrated circuit package. In this embodiment, the anisotropic conductive film is bonded to a top surface of the first integrated circuit package through a thermocompression technique. The anisotropic conductive film is placed on the top surface of the first integrated circuit package and sufficient pressure is applied to the anisotropic conductive film for bonding the anisotropic conductive film to a plurality of copper pads disposed on the first integrated circuit package. In one exemplary embodiment, a temperature for bonding the anisotropic conductive film to the first integrated circuit package is between about 90° C. and about 100° C. Further, a bonding time is between about 3 seconds to about 5 seconds.

At block 56, a second integrated circuit package is disposed on a top surface of the anisotropic conductive film. In this exemplary embodiment, a bottom surface of the second integrated circuit package includes a solder paste disposed in a plurality of locations to bond the second integrated circuit package with the anisotropic conductive film.

Further, at block 58, the first and second integrated circuit packages are bonded to align the plurality of conductive particles between the first and second integrated circuit packages. In this exemplary embodiment, the first and second integrated circuit packages are subjected to thermocompression to attach the first and second integrated circuit packages. Further, the thermcompression process also cures adhesive material of the anisotropic conductive film thereby eliminating the need of mechanical connection between the first and second packages.

In one exemplary embodiment, the structure described above is bonded at a temperature of between about 150° C. and about 210° C. In one exemplary embodiment, a bonding time is between about 5 seconds to about 20 seconds. In this exemplary embodiment, the conductive particles are disposed between the plurality of copper pads of the first integrated circuit package and corresponding solder paste of the second integrated package. In certain embodiments, a gap height between the first and second integrated circuit packages may be controlled by controlling the thickness of the anisotropic conductive film.

FIG. 3 illustrates an exemplary configuration 60 of the anisotropic conductive film 14 employed in the package-on-package assembly 10 of FIG. 1. In the illustrated embodiment, the anisotropic conductive film 60 includes an adhesive film 62 and the plurality of conductive particles, such as represented by reference numeral 16 disposed within the adhesive film 62. Further, the anisotropic conductive film 60 includes a release liner 64 disposed on a top surface 66 of the adhesive film 62. In operation, the release liner 64 prevents bondhead from adhering to the anisotropic conductive film 60 during the lamination process. The release liner 64 is subsequently removed to prevent damage to the anisotropic conductive film 60. In one exemplary embodiment, the anisotropic conductive film 60 includes a polyester film with a silicone release liner disposed on the top surface 66 of the polyester film.

In certain embodiments, the plurality of conductive particles 16 include cylindrical, or square, or cubical, or round shaped metal coated conductive particles. However, other shapes of the plurality of conductive particles 16 may be envisaged. In one embodiment, the plurality of conductive particles 16 comprise a polymer coated with gold. In another embodiment, the plurality of conductive particles 16 comprise a polymer coated with nickel and gold. In another embodiment, the plurality of conductive particles 16 comprise gold coated with nickel. In yet another embodiment, the plurality of conductive particles 16 comprise a glass bead coated with silver. However, a variety of other materials may be employed for the plurality of conductive particles 16.

In this exemplary embodiment, the anisotropic conductive film 60 has a square form factor. In one exemplary embodiment, a thickness of the anisotropic conductive film 60 is between about 20 microns to about 80 microns. In certain embodiments, the thickness of the anisotropic conductive film 60 is selected to achieve a desired gap height 36 (see FIG. 1) between the first and second integrated circuit packages 12 and 20 (see FIG. 1) of the package-on-package assembly 10.

FIG. 4 illustrates an exemplary configuration 70 for bonding the anisotropic conductive film 14 to the first integrated circuit package 12 of the package-on-package assembly 10 of FIG. 1. In the illustrated embodiment, the first integrated circuit 12 includes the die 24 coupled to the substrate 26 through the collapse chip connection bumps 28. Further, the anisotropic conductive film 14 is laminated to the top surface 18 of the first integrated circuit package 12. In this exemplary embodiment, the first integrated circuit package 12 includes a plurality of copper pads disposed on the top surface 18 of the first integrated circuit package 12.

In one embodiment, a loader 72 is employed to apply sufficient pressure for bonding the anisotropic conductive film 14 to the first integrated circuit package 12. In one exemplary embodiment, the pressure applied to the anisotropic conductive film is between about 2 Kg/cm$^2$ to about 3

Kg/cm². In one exemplary embodiment, a temperature for bonding the anisotropic conductive film to the first integrated circuit package is between about 90° C. and about 100° C. Further, a bonding time is between about 3 seconds to about 5 seconds.

Figure 5:
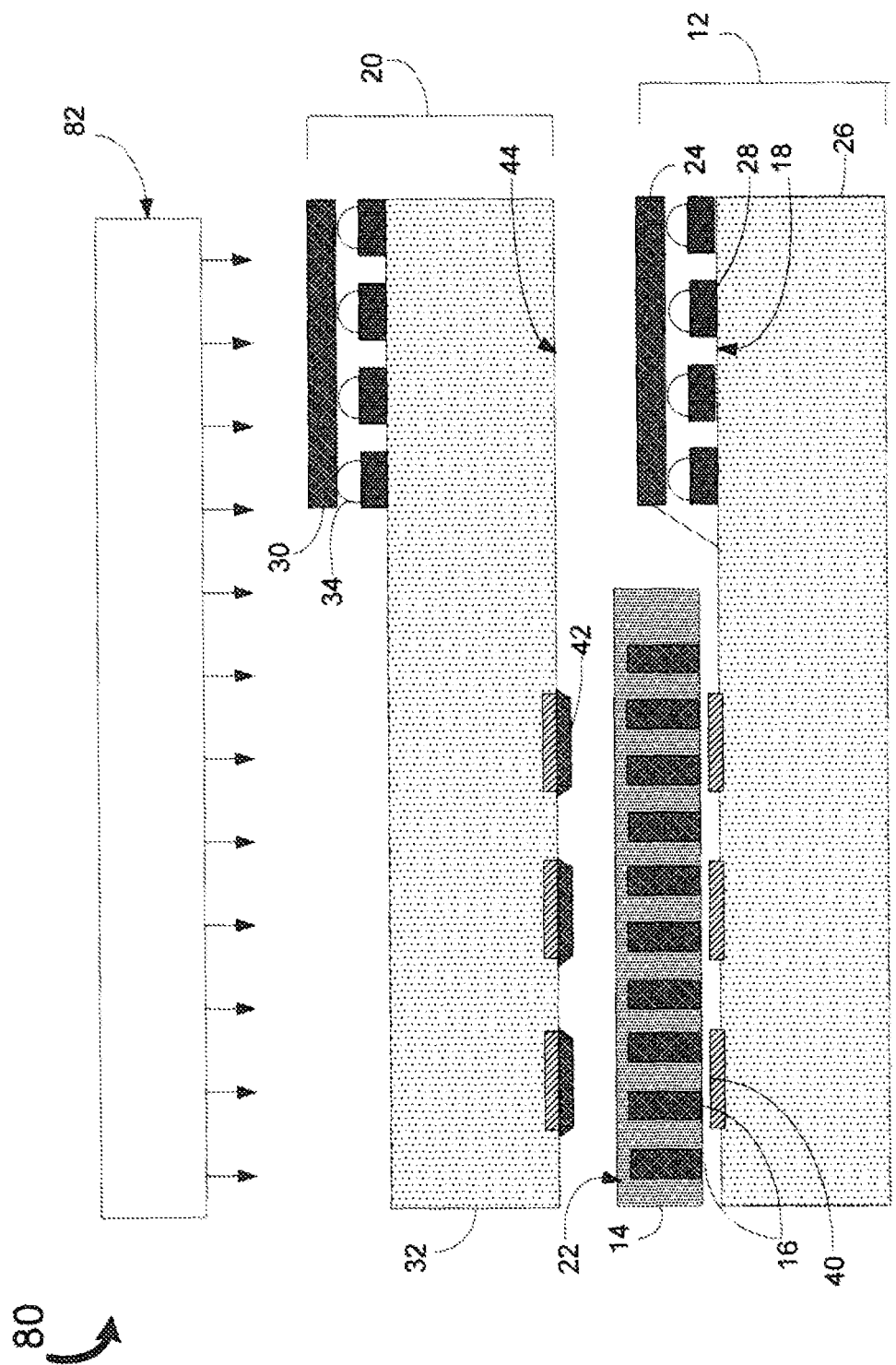
FIG. 5 illustrates an exemplary configuration for bonding the first integrated circuit package to the anisotropic conductive film of FIG. 4 in accordance with embodiments of present technique.

FIG. 5 illustrates an exemplary configuration 80 for bonding the first integrated circuit package 20 to the anisotropic conductive film 14 of FIG. 4. As illustrated, the second integrated circuit package 20 includes the die 30 coupled to the substrate 32 through the plurality of controlled collapse chip connection bumps 34. Further, the second integrated circuit package 20 includes the solder paste 42 disposed in a plurality of locations on the bottom surface 44 of the second integrated circuit package 20.

In this exemplary embodiment, the second integrated circuit package 20 is stacked on the anisotropic conductive film 14 and undergoes a thermocompression process for bonding and curing the adhesive film 62. Again, a loader 82 may be employed to apply sufficient pressure to provide the bonding between the solder paste 42 of the second integrated circuit package 20 and the anisotropic conductive film 14.

In one exemplary embodiment, a bonding temperature is between about 150° C. and about 210° C. In one exemplary embodiment, a bonding time is between about 5 seconds to about 20 seconds. In this exemplary embodiment, the conductive particles 14 are disposed between the plurality of copper pads 40 of the first integrated circuit package 12 and corresponding solder paste 42 of the second integrated package 20 to form the package-on-package assembly 10 illustrated in FIG. 1.

Figure 6:
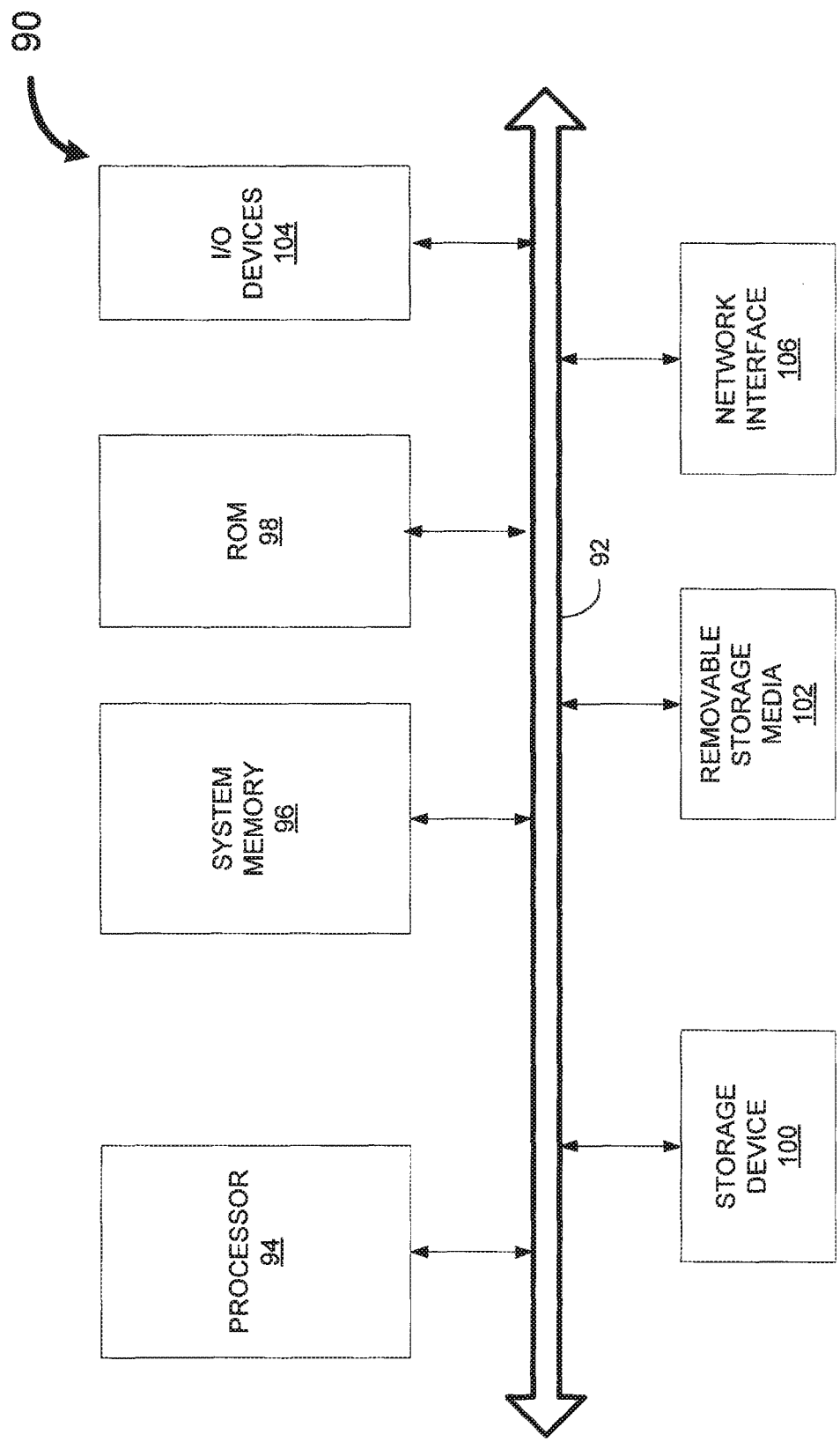
FIG. 6 illustrates an embodiment of a computer system.

The device described above may be disposed in a computer system, a wireless communicator and a hand-held device. FIG. 6 illustrates an embodiment of a computer system 90. The computer system 90 includes a bus 92 to which the various components are coupled. In certain embodiments, the bus 92 includes a collection of a plurality of buses such as a system bus, a Peripheral Component Interface (PCI) bus, a Small Computer System Interface (SCSI) bus, etc. Representation of these buses as a single bus 92 is provided for ease of illustration, and it should be understood that the system 90 is not so limited. Those of ordinary skill in the art will appreciate that the computer system 90 may have any suitable bus architecture and may include any number of combination of buses.

A processor 94 is coupled to the bus 92. The processor 94 may include any suitable processing device or system, including a microprocessor (e.g., a single core or a multi-core processor), a network processor, an application specific integrated circuit (ASIC), or a field programmable gate array (FPGA), or any similar device. It should be noted that although FIG. 6 shows a single processor 94, the computer system 90 may include two or more processors.

The computer system 90 further includes system memory 96 coupled to the bus 92. The system memory 96 may include any suitable type and number of memories, such as static random access memory (SRAM), dynamic random access memory (DRAM), synchronous dynamic random access memory (SDRAM), or double data rate DRAM (DDRDRAM). During operation of the computer system 90, an operating system and other applications may be resident in the system memory 96.

The computer system 90 may further include a read-only memory (ROM) 98 coupled to the bus 92. The ROM 98 may store instructions for the processor 94. The computer system 90 may also include a storage device (or devices) 100 coupled to the bus 92. The storage device 100 includes any suitable non-volatile memory, such as, for example, a hard disk drive. The operating system and other programs may be stored in the storage device 100. Further, a device 102 for accessing removable storage media (e.g., a floppy disk drive or a CD ROM drive) may be coupled to the bus 92.

The computer system 90 may also include one or more Input/Output (I/O) devices 104 coupled to the bus 92. Common input devices include keyboards, pointing devices such as a mouse, as well as other data entry devices. Further, common output devices include video displays, printing devices, and audio output devices. It will be appreciated that these are but a few examples of the types of I/O devices that may be coupled to the computer system 90.

The computer system 90 may further comprise a network interface 106 coupled to the bus 92. The network interface 106 comprises any suitable hardware, software, or combination of hardware and software that is capable of coupling the system 90 with a network (e.g., a network interface card). The network interface 106 may establish a link with the network over any suitable medium (e.g., wireless, copper wire, fiber optic, or a combination thereof) supporting exchange of information via any suitable protocol such as TCP/IP (Transmission Control protocol/Internet Protocol), HTTP (HyperText Transmission Protocol, as well as others.

It should be understood that the computer system 90 illustrated in FIG. 6 is intended to represent an embodiment of such a system and, further, that this system may include any additional components, which have been omitted for clarity and ease of understanding. By way of example, the system 90 may include a direct memory access (DMA) controller, a chip set associated with the processor 94, additional memory (e.g., cache memory) as well as additional signal lines and buses. Also, it should be understood that the computer system 90 may not include all the components shown in FIG. 6. The computer system 90 may comprise any type of computing device, such as a desktop computer, a laptop computer, a server, a hand-held computing device, a wireless communication device, an entertainment system etc.

In this embodiment, the computer system 90 may include the device as described in the embodiments above. By way of example, the computer system 90 may include at least one package-on-package assembly. The package-on-package assembly may include a first integrated circuit package and an anisotropic conductive film (ACF) having a plurality of conductive particles disposed on a top surface of the first integrated circuit package. The package-on-package assembly may also include a second integrated circuit package disposed on a top surface of the anisotropic conductive film.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

The invention claimed is:

1. A method of forming a package-on-package assembly, comprising:
   laminating an anisotropic conductive film on a top surface of a first integrated circuit package, wherein the anisotropic conductive film comprises a plurality of conductive particles disposed within the anisotropic conductive film;
   disposing a second integrated circuit package on a top surface of the anisotropic conductive film; and bonding the first and second integrated circuit packages to align the plurality of conductive particles between the first and second integrated circuit package, wherein bonding the first and second integrated circuit packages comprises bonding the plurality of conductive particles to a solder paste disposed on a plurality of locations on the second integrated circuit package.

2. The method of claim 1, wherein laminating the anisotropic conductive film on the top surface of the first integrated circuit package comprises bonding the plurality of conductive particles to a plurality of copper pads disposed on the top surface of the first integrated circuit package.

3. The method of claim 1, wherein bonding the first and second integrated circuit packages to align the plurality of conductive particles between the first and second integrated circuit package electrically couples the first integrated circuit package to the second integrated circuit package.

4. The method of claim 1, wherein laminating the anisotropic conductive film on the top surface of the first integrated circuit package comprises laminating the anisotropic conductive film on the top surface of the first integrated circuit package, wherein the anisotropic conductive film comprises the plurality of conductive particles disposed within a polyester film.

5. The method of claim 1, wherein laminating the anisotropic conductive film on the top surface of the first integrated circuit package comprises laminating the anisotropic conductive film, having a thickness of between about 20 microns and about 80 microns, on the top surface of the first integrated circuit package.

6. The method of claim 1, further comprising disposing a release liner on the top surface of the anisotropic conductive film.

7. The method of claim 1, wherein bonding the first and second integrated circuit packages comprises bonding at a bonding temperature between about 150° C. to about 210° C.

8. The method of claim 7, wherein bonding the first and second integrated circuit packages comprises bonding at for a bonding time between about 5 seconds to about 20 seconds.

9. The method of claim 1, wherein laminating the anisotropic conductive film on the top surface of the first integrated circuit package comprises laminating the anisotropic conductive film, having a uniform array of the conductive particles disposed within the anisotropic conductive film, on the top surface of the first integrated circuit package.

10. The method of claim 9, wherein a thickness of each of the conductive particles is about 150 microns.

11. The method of claim 9, wherein a pitch of the conductive particles is about 100 microns.

12. A method of forming a package-on-package assembly, comprising:
    laminating an anisotropic conductive film on a top surface of a first integrated circuit package, wherein the anisotropic conductive film comprises a plurality of conductive particles disposed within the anisotropic conductive film;
    disposing a second integrated circuit package on a top surface of the anisotropic conductive film; and
    bonding the first and second integrated circuit packages to align the plurality of conductive particles between the first and second integrated circuit package;
    wherein laminating the anisotropic conductive film on the top surface of the first integrated circuit package comprises laminating the anisotropic conductive film on the top surface of the first integrated circuit package that includes a plurality of copper pads disposed on the top surface thereof; and wherein disposing the second integrated circuit package on the anisotropic conductive film top surface comprises disposing the second integrated circuit package having solder disposed in a plurality of locations on the top surface thereof corresponding to the plurality of copper pads disposed on the top surface of the first integrated circuit package.

13. The method of claim 12, wherein the anisotropic conductive film is disposed between the plurality of copper pads and the corresponding solder paste.

* * * * *